(12) United States Patent
Savelli et al.

(10) Patent No.: US 6,441,690 B1
(45) Date of Patent: Aug. 27, 2002

(54) PHASE-LOCKED LOOP FREQUENCY SYNTHESIZER

(75) Inventors: Patrick Savelli, Paris; Christian Massy, Sevres, both of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/645,360

(22) Filed: Aug. 25, 2000

(30) Foreign Application Priority Data

Aug. 26, 1999 (FR) .............................. 99 10798

(51) Int. Cl.[7] .............................. H03C 3/09; H03L 7/18
(52) U.S. Cl. .............................. 331/1 A; 331/25; 331/16; 331/17; 331/175
(58) Field of Search .............................. 331/16, 1 A, 17, 331/25, 175

(56) References Cited

U.S. PATENT DOCUMENTS

| 4,309,674 A | 1/1982 | Owen | 332/124 |
|---|---|---|---|
| 4,706,047 A | 11/1987 | Avila | 332/117 |
| 5,097,230 A | 3/1992 | Lautzenhiser | 332/127 |
| 5,207,491 A | 5/1993 | Rottinghaus | 331/16 |
| 5,839,059 A | 11/1998 | Haekkinen | 455/115 |

FOREIGN PATENT DOCUMENTS

| EP | 0 153 868 A2 | 9/1985 |
|---|---|---|
| EP | 0 961 412 A1 | 12/1999 |
| GB | 2 337 884 A1 | 12/1999 |
| WO | 81 03250 | 11/1981 |

Primary Examiner—Arnold Kinkead
(74) Attorney, Agent, or Firm—Sughrue Mion, PLLC

(57) ABSTRACT

A phase-locked loop frequency synthesizer includes circuitry which determines the real gain of a voltage-controlled oscillator from at least one measurement parameter and delivers a signal representative of the real gain of the voltage-controlled oscillator.

4 Claims, 2 Drawing Sheets

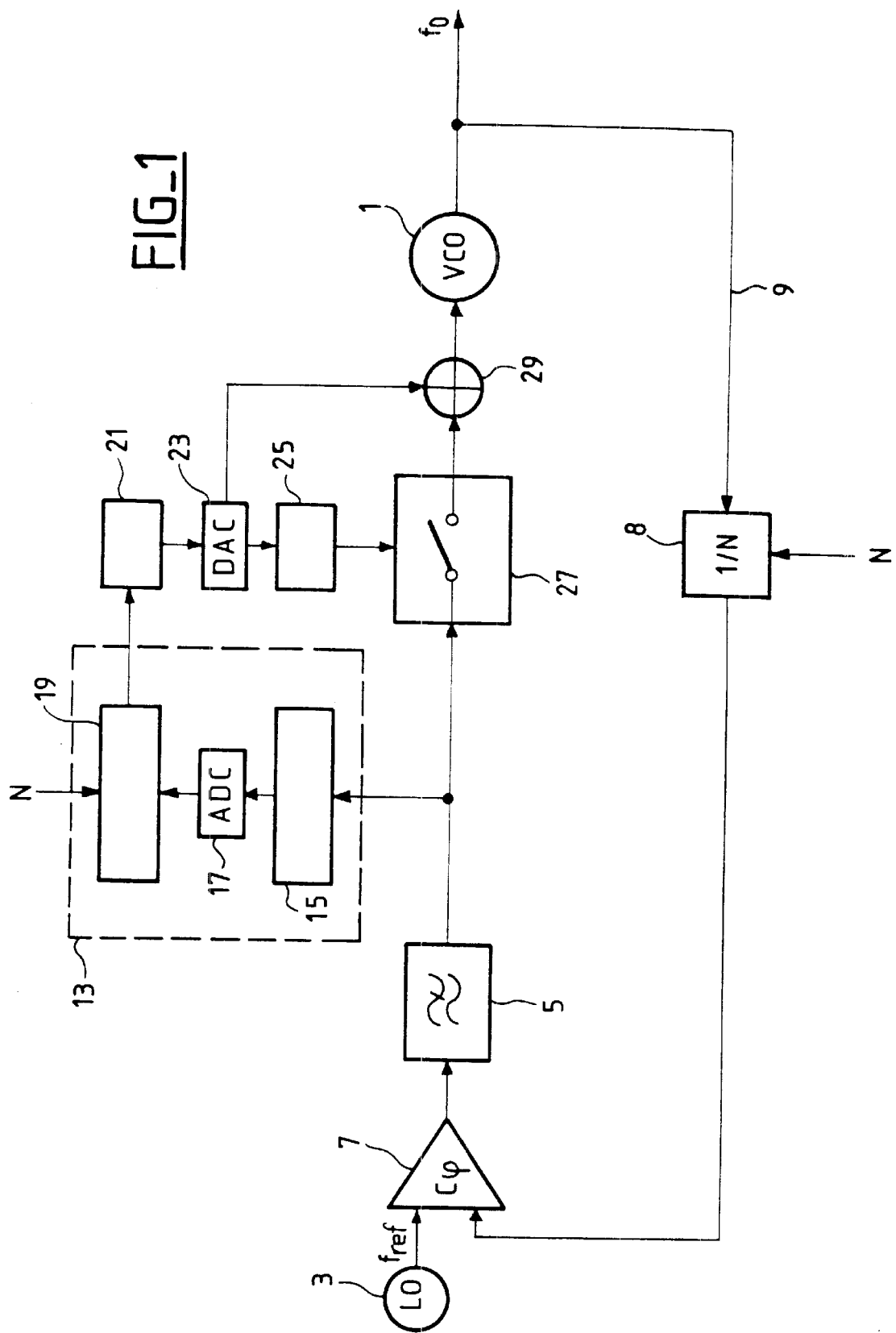
FIG_1

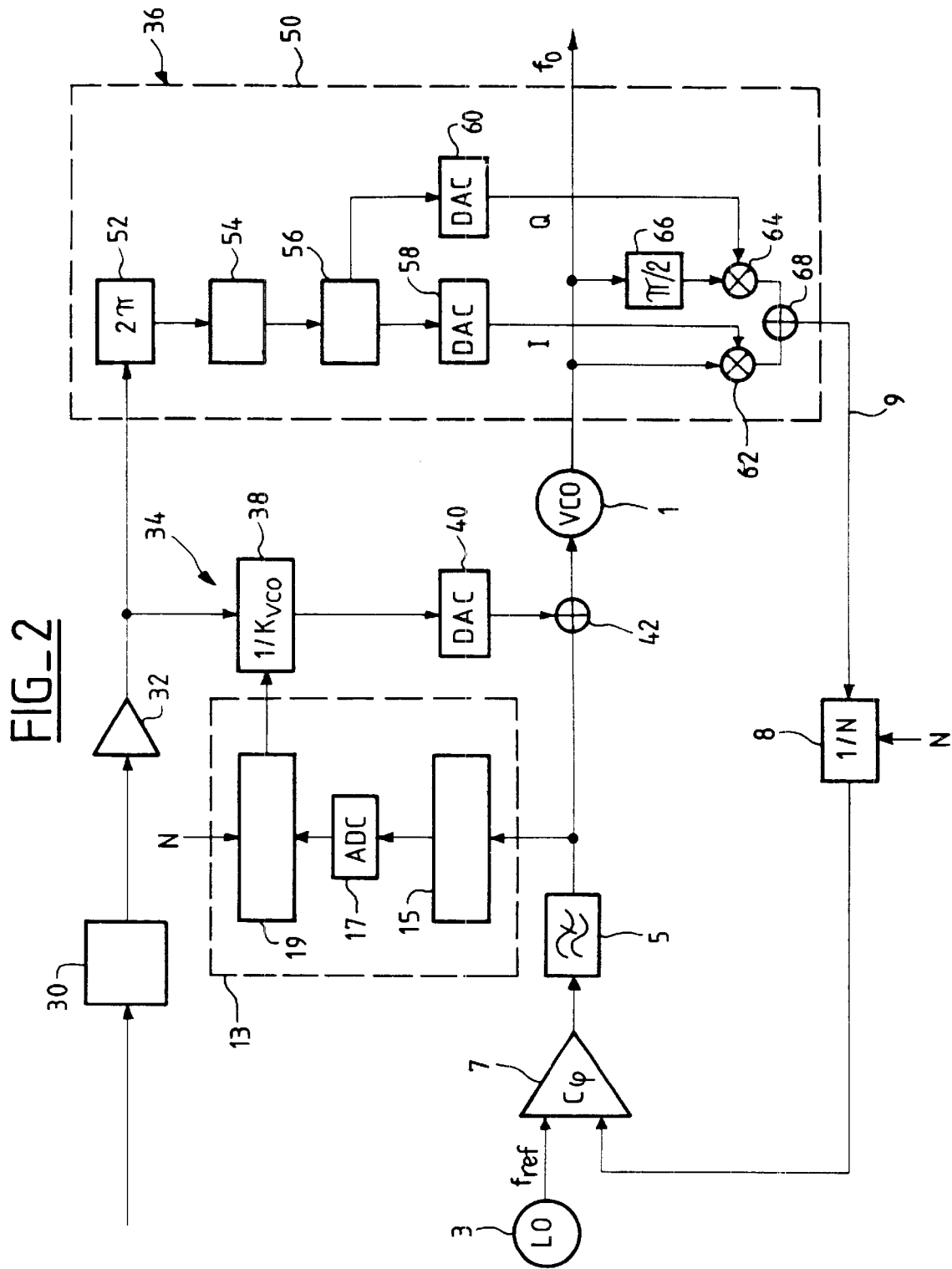
FIG_2

PHASE-LOCKED LOOP FREQUENCY SYNTHESIZER

BACKGROUND OF THE INVENTION

1. Field of the Invention

The present invention relates to a frequency synthesizer, also referred to as controlled oscillator circuit, for use in particular in radio frequency transmitters and receivers. It can be used in the field of mobile telephones in particular, for which fast locking onto a carrier is particularly essential. One object of the invention is therefore to provide means for effective locking on.

2. Description of the Prior Art

In the mobile telephone field, in particular in the GSM (Global System for Mobile communications) and using the TDMA (Time-Division Multiple Access) technique, communication channels are set up to connect mobile telephones to base stations. A channel is defined by a time slot chosen from a plurality of time slots in the same frame. In one of the best known applications a frame comprises eight windows. Another feature of a channel is that it is associated with a carrier frequency. A set of modulation bands is therefore distributed within a range of transmit or receive frequencies. For example, according to the GSM standard a band has a width of 200 kHz and there are more than 100 different carrier frequencies in a range.

Because of propagation deficits at some frequencies between some locations, it is accepted that a frequency law obliges the carrier frequency (at the bandwidth in use) of a particular channel to change periodically. In practice it is changed for every frame. Thus the connection between a mobile telephone and a base station uses a carrier frequency that changes regularly. This requires a transceiver frequency synthesizer that can hop regularly and quickly from one carrier frequency to another.

Under the GSM standard, a time slot has a standardized duration of 577 microseconds. A frame of eight windows therefore has a duration of 4.615 milliseconds. One slot in a frame is used to transmit and another slot in the same frame is used to receive. The time difference between the transmit time slot and the receive time slot is normally at least equal to 1.5 times the duration of a time slot. This means that a mobile telephone transceiver, in particular a transceiver in a mobile telephone, has approximately 865 microseconds to lock onto the carrier frequency allocated to it, in particular to provide duplex communication.

However, in GPRS/HSCSD (General Packet Radio Service/High Speed Circuit Switch Data) systems, in order to increase the data bit rate, a mobile telephone and/or the base station can transmit and/or receive radio signals during successive time slots of the same frame. It is therefore possible for two, three or four successive slots of the some frame to be allocated to one direction of communication between a mobile telephone and a base station. In this case, the carrier frequency does not change from one slot to the other.

However, this kind of practice has led to modification of the standard. Because of such consecutive use, the number of slots remaining available in the same frame is reduced, with the result that it is no longer possible to provide a time separation of at least 1.5 times the slot duration between the two communication directions. This being the case, the standard provides for only one time slot to be neutralized between transmission and reception. As a result, the acquisition times for the oscillators to lock onto the carrier frequencies are reduced. Whereas before, with 865 microseconds available, a lock-on time of 500 microseconds was acceptable, this is no longer acceptable if the acquisition time is reduced to 577 microseconds.

Presetting the frequency of the phase-locked loop (PLL) of the synthesizer to accelerate locking onto a carrier frequency is described in U.S. Pat. No. 4,105,948.

To this end, the PLL is opened for a short time period by a switch between the loop filter and the voltage-controlled oscillator (VCO) and an external voltage is fed to the VCO to force it to generate a signal whose frequency is close to the required frequency. Then, after a particular time-delay, the phase-locked loop is closed again for the synthesizer to adjust itself automatically to the new carrier frequency.

The external voltage applied to the oscillator to force it to change frequency virtually instantaneously is deduced from the nominal gain of the voltage-controlled oscillator. The presetting of the voltage-controlled oscillator of the PLL is more effective when the gain of the VCO is known accurately.

However, it has been found that, after installation, the real gain of the voltage-controlled oscillator can vary as a function of various parameters, for example the external temperature or the time for which the oscillator has been in operation. Consequently, the nominal gain of the VCO and its real gain can be significantly different, depending on external operating parameters, which makes presetting less effective and therefore increases the time for the synthesizer to lock onto the new carrier frequency.

It is therefore clear that it is important to master the variation in the gain of the VCO to minimize the acquisition time of the synthesizer.

Another, related problem of prior art phase-locked loop frequency synthesizers is that of processing noise in the loop.

Prior art synthesizers conventionally include a voltage-controlled oscillator which is controlled by comparing the phase of the signal produced by the oscillator with the phase of a reference signal representative of the required oscillation frequency. This requires the provision in the control loop of a low-pass filter whose bandwidth is limited by the comparison frequency of the phase comparator.

A phase comparator compares signals and produces an error signal at its output. The oscillator is controlled by the error signal. The error signal is smoothed by a low-pass filter. The cut-off frequency of the low-pass filter is substantially equal to one tenth of the comparison frequency. At the frequencies considered here, with a comparison frequency of 200 kHz, this requires a filter with a time constant of the order of 50 microseconds. The acquisition time is then of the order of 500 microseconds, on average, and cannot be reduced.

If a synthesizer of the above kind is used for transmission, the reference frequency is modulated at the input of the phase comparator. A circuit of this kind requires a greater bandwidth of the loop and therefore of the loop filter between the phase comparator and the voltage-controlled oscillator.

Consequently, noise within the bandwidth of the loop is increased and in particular it is difficult to conform to the spectrum recommended by the GSM standard.

An object of the invention is therefore to propose a phase-locked loop frequency synthesizer having improved noise characteristics compared to the prior art. Another object of the invention is to propose a phase-locked loop frequency synthesizer in which the variations in the gain of the voltage-controlled oscillator can be controlled.

A further object of the invention is to propose a phase-locked loop frequency synthesizer having a short acquisition time.

SUMMARY OF THE INVENTION

To this end, the invention provides a frequency synthesizer including a phase regulation loop including a voltage-controlled oscillator, a reference oscillator, a phase-locked loop receiving as input the signal from the voltage-controlled oscillator and the signal from the reference oscillator, delivering at its output the control voltage for the voltage-controlled oscillator and including a phase comparator connected directly to an output of the reference oscillator and to an output of the voltage-controlled oscillator via a feedback loop including a counter-divider, means for feeding a modulation signal between the phase comparator and the voltage-controlled oscillator and modulation compensation means for preparing a compensation signal from the modulation signal and for feeding the compensation signal into the feedback loop upstream of the counter-divider to cancel the modulation of the signal at the output of the voltage-controlled oscillator applied to the input of the counter.

In one embodiment the synthesizer according to the invention includes means for determining the real gain of the voltage-controlled oscillator from at least one measurement parameter and the determination means are adapted to deliver a signal representative of the real gain of the voltage-controlled oscillator.

In one embodiment the synthesizer according to the invention further includes divider means having a first input adapted to receive from the determination means the signal representative of the real gain of the voltage-controlled oscillator, a second input adapted to receive the modulation signal, and an output delivering the modulation signal divided by the real gain of the voltage-controlled oscillator and connected to an input of a summation circuit between the voltage-controlled oscillator and a loop filter between the output of the phase comparator and the input of the voltage-controlled oscillator.

The synthesizer according to the invention can have any one or more of the following features:

the synthesizer further includes a loop filter between the output of the phase comparator and the input of the voltage-controlled oscillator and the determination means include measuring means for measuring the output voltage of the loop filter at a first frequency and at a second frequency and a calculation unit for calculating the real gain of the voltage-controlled oscillator by dividing the difference between the first and second frequencies by the difference between the first and second control voltages respectively measured at the first and second frequencies, the determination means further include an analog-to-digital converter adapted to convert a voltage measured by the measuring means into a digital signal and the calculation unit is a digital unit, the determination means include a temperature sensor, a memory for storing a table of the gain of the voltage-controlled oscillator as a function of temperature and a control unit for delivering the real gain of the voltage-controlled oscillator as a function of the measured temperature and the gain values stored in the memory, the determination means include means for measuring the operation time of the voltage-controlled oscillator, a memory for storing a table of the gain of the voltage-controlled oscillator as a function of its operating time and a control unit for delivering the real gain of the voltage-controlled oscillator as a function of the operation time delivered by the counter and the gain values stored in the memory, the compensation means include a multiplier for multiplying the modulation signal by $2\pi$, an accumulator whose input is connected to the output of the multiplier, a unit for forming an in-phase signal I and a quadrature signal Q, a first mixer, and a second mixer, wherein each mixer is in a branch of the feedback loop upstream of the counter-divider, the first mixer is adapted to mix the in-phase signal I with the output signal of the voltage-controlled oscillator and the second mixer is adapted to mix the quadrature signal Q with the output signal of the voltage-controlled oscillator phase-shifted by $\pi/2$.

Other features and advantages of the invention emerge from the following description, which is given by way of non-limiting example and with reference to the accompanying drawings.

BRIEF DESCRIPTION OF THE DRAWINGS

FIG. 1 is a block diagram of a frequency synthesizer according to the invention.

FIG. 2 is a block diagram of a modified frequency synthesizer according to the invention.

DETAILED DESCRIPTION OF THE PREFERRED EMBODIMENTS

A synthesizer according to the invention is preferably installed in a mobile telephone, in particular a mobile telephone operating to one or more of the following standards: GSM, DCS, PCS, UMTS.

FIG. 1 shows that the phase-locked loop frequency synthesizer includes a voltage-controlled oscillator (VCO) 1 slaved to a reference oscillator 3 by a phase-locked loop (PLL). The phase-locked loop includes a loop filter 5, a phase-frequency comparator 7 and a counter-divider 8.

The loop filter 5 is connected between the control voltage input of the VCO 1 and the output of the phase-frequency comparator 7.

The phase-frequency comparator 7 has two inputs, the first of which is connected directly to the output of the reference oscillator 3 and the second of which is connected to the output of the VCO 1 via a feedback loop 9 including the counter-divider 8.

The counter-divider 8 has an input for receiving a command setting its divisor N.

The synthesizer further includes means 13 for determining the real gain of the VCO 1.

The means 13 for determining the real gain of the VCO include a measurement sensor 15 for measuring a first control voltage $V_1$ at a first frequency $f_1$ and a second control voltage $V_2$ at a second frequency $f_2$ at the output of the loop filter 5. The frequencies $f_1$ and $f_2$ are preferably carrier frequencies defined in the standard(s) under which a mobile telephone including the synthesizer according to the invention operates, namely the GSM, DCS, PCS or UMTS standard(s). To carry out its measurements, the sensor 15 preferably exploits the periodic change of carrier frequency imposed by the above standards.

The output of the sensor 15 is connected to the input of an analog-to-digital converter 17 which converts the measured voltages into digital signals.

The output of the converter 17 is connected to the input of a calculation unit 19 which divides the difference between the first and second frequencies by the difference between the first and second measured voltages.

The real gain $K_{VCO}$ of the VCO 1 is given by the following equation:

$$K_{VCO} = \frac{f_2 - f_1}{V_2 - V_1}$$

To enable it to calculate the frequencies $f_1$ and $f_2$, the unit 19 receives on an input the divisor N applied to the counter-divider 8. Because the output frequency of a phase-locked loop synthesizer is given by the following equation:

$$f_0 = N \times f_{ref}$$

and because $f_{ref}$ is known accurately, the unit 19 calculates the real gain $K_{VCO}$ from the following equation:

$$K_{VCO} = \frac{N_2 - N_1}{V_2 - V_1} f_{ref}$$

where $N_1$ and $N_2$ are the divisors of the counter-divider 8 at the respective frequencies $f_1$ and $f_2$.

The real gain of the VCO 1 is advantageously determined only each time that the mobile terminal including the synthesizer according to the invention is initialized.

It is of course feasible to update the gain more frequently, especially if the mobile terminal is moving around, for example, in an environment subject to large temperature fluctuations, as in winter time, for example, because of the temperature difference between indoors and outdoors.

In a variant of the synthesizer according to the invention that is not shown, and is particularly suited to synthesizers used in an environment subject to high temperature fluctuations, said means for determining the real gain include a temperature sensor, a memory containing a table of the gain of the voltage-controlled oscillator as a function of temperature, and a control unit adapted to deliver the real gain of the VCO 1 as a function of the measured temperature and the gain values stored in memory in the table.

In another advantageous variant of the synthesizer according to the invention that is not shown, the determination means 13 include means for measuring the operating time of the VCO 1, such as an operating time counter, a memory containing a table of the gain of the VCO 1 as a function of its operating time, and a control unit adapted to deliver the real gain of the VCO 1 as a function of the operating time received from the counter and the gain values stored in memory in the table.

One output of the calculation unit 19 is connected to a corresponding input of a control unit 21 controlling a presetting voltage applied to the VCO 1.

The control unit 21 is preferably an all-digital unit with its output connected to an input of a digital-to-analog converter 23.

The output of the converter 23 is connected to a time-delay circuit 25 which controls a switch 27 in the phase-locked loop downstream of the loop filter 5 and to a summation circuit 29 in the phase-locked loop between the switch 27 and the VCO 1 which enables application of the presetting voltage to the VCO 1.

In operation, the VCO 1 delivers an output signal at the frequency $f_0$ of the frequency synthesizer. The reference oscillator 3 delivers a reference signal at the frequency fref.

The counter-divider 8 divides the frequency $f_0$ of the VCO 1, in this example by an integer N, before submitting it to the phase-frequency comparator 7, with the result that the phase-locked loop implements the equation:

$$f_0 = N \times f_{ref}$$

At least during the initialization phase, to enable optimum presetting of the phase-locked loop during a change of synthesizer output frequency the means 13 determine the real gain of the VCO 1 as a function of a measurement parameter such as the voltage downstream of the loop filter 5, the operating temperature or the operating time.

The real gain is delivered to the control unit 21. During a phase-locked loop output frequency change, the switch 27 opens the phase-locked loop for a predetermined time period, under the control of the time-delay circuit 25, and during this time period a presetting voltage is applied to the VCO 1 via the summation circuit 27. The presetting voltage is determined by the unit 21 as a function of the real gain of the VCO 1.

Accordingly, knowing the real gain of the VCO 1, the presetting voltage produces an output frequency very close to the required output frequency and the phase-locked loop locks on faster when the switch 27 is closed again.

Clearly, controlling the real gain of the VCO 1 shortens the acquisition time of the phase-locked loop regardless of the operating environment, because the synthesizer according to the invention is less sensitive to gain fluctuations due to external or internal influences, for example temperature variations or aging.

FIG. 2 shows a block diagram of a variant of the invention. In FIG. 2, items identical to items in FIG. 1 carry the same reference numbers.

The improvement of the FIG. 2 synthesizer over that shown in FIG. 1 lies in particular in the fact that it is a modulated synthesizer with no presetting.

To this end, the synthesizer according to the invention includes a Gaussian filter 30 receiving at its input digital signals representative of the data to be transmitted and an amplifier 32 for amplifying the filtered signals at the output of the filter 30.

The output of the amplifier 32 is connected to a modulation branch 34 and to a compensation branch 36.

The modulation branch 34 includes a divider 38 having a first input receiving the filtered and amplified signals from the output of the amplifier 32 and a second input receiving an output signal of the calculation unit 19 representative of the determined real gain $K_{VCO}$ of the voltage-controlled oscillator 1.

The divider 38 is adapted to divide the filtered and amplified modulation signal by the determined real gain of the VCO 1. The output of the divider 38 is connected to the input of a digital-to-analog converter 40 converting the output signal of the divider 38 into an analog signal.

The output of the converter 40 is connected to one of two inputs of a summation circuit 42 between the loop filter 5 and the VCO 1. The other input of the summation circuit 42 is connected to the output of the loop filter 5 and the output of the circuit 42 is connected to the input of the voltage-controlled oscillator 1. The modulation branch 34 therefore prepares the modulation signal and feeds it into the phase-locked loop PLL.

In order not to pollute the signal in the feedback loop 9 with the modulation at the output of the VCO 1, and to guarantee that the synthesized frequency is highly stable, the synthesizer according to the invention further includes, in the compensation branch 36, compensation means 50 for preparing a compensation signal from the modulation signal and for feeding the compensation signal into the feedback loop 9 upstream of the counter-divider 8.

The compensation means 50 include a multiplier 52 which multiplies the modulation signal at the output of the amplifier 32 by $2\pi$, an accumulator 54 whose input is connected to the output of the multiplier 52, and a unit 56 for forming an in-phase signal I and a phase quadrature signal Q by means of cosine and sine transformations which are known in the art.

The multiplier 52, the accumulator 54 and the unit 56 are advantageously digital components.

The in-phase digital signal I and the quadrature digital signal Q at the output of the unit 56 are converted into analog signals by respective converters 58 and 60.

The in-phase analog signal I is then fed into one of the two inputs of a first mixer 62. The other input of the mixer 62 receives the modulated signal at the output of the VCO 1 and mixes the in-phase signal I with the output signal of the voltage-controlled oscillator.

The quadrature analog signal Q is fed into one of two inputs of a second mixer 64. The other input of the mixer 64 receives the modulated signal at the output of a phase-shifter 66 which applies a phase shift of $\pi/2$ to the output signal of the VCO 1 to mix the quadrature signal Q with the output signal of the voltage-controlled oscillator phase-shifted by $\pi/2$.

Finally, the output signals of the mixers 62 and 64 are applied to the corresponding inputs of a summation circuit 68. The output of the summation circuit is connected to the input of the counter-divider 8.

The operation of the synthesizer shown in FIG. 2 differs from that shown in FIG. 1 in that there is no presetting at the time of an output frequency change and a specially prepared modulation signal is fed into the phase-locked loop between the loop filter 5 and the VCO 1. The synthesizer can therefore use a stable and unmodulated reference oscillator 3. A signal at the frequency $f_0$ modulated by the modulation signal is therefore obtained at the output of the VCO 1.

Dividing the modulation signal by the real gain of the VCO 1 reduces the phase error of the modulation at the output of the VCO 1.

The gain of the VCO 1 is compensated digitally. Compensation is needed because the phase of the modulated signal would otherwise be affected by the gain, which would modify the modulation index.

Also, for the signal fed into the counter-divider 8 to be an unmodulated signal at the frequency $f_0$, the modulation of the output signal of the VCO 1 is cancelled in the feedback loop 9 by preparing in-phase and quadrature compensation signals I and Q and feeding them into the feedback loop 9.

Because the signal fed into the counter-divider 8 is an unmodulated signal at the frequency $f_0$, the bandwidth of the loop filter 5 can be smaller, which provides an effective reduction in the level of noise in the phase-locked loop PLL.

The embodiments shown in FIGS. 1 and 2 can of course be combined to obtain a modulated synthesizer using frequency presetting.

What is claimed is:

1. A frequency synthesizer including a phase regulation loop including:

a voltage-controlled oscillator;

a reference oscillator;

a phase-locked loop receiving as inputs an output signal from said voltage-controlled oscillator and an output signal from said reference oscillator, delivering at its output a control voltage to an input of said voltage-controlled oscillator, and including a phase comparator connected directly to the output of said reference oscillator and to an output of said voltage-controlled oscillator via a feedback loop including a counter-divider;

means for feeding a modulation signal between said phase comparator and the input of said voltage-controlled oscillator;

modulation compensation means for preparing a compensation signal from said modulation signal and for feeding said compensation signal into said feedback loop upstream of said counter-divider to cancel modulation of a synthesizer output signal, at the output of said voltage-controlled oscillator, applied to an input of said counter-divider;

determination means for determining the real gain of said voltage-controlled oscillator from at least one measurement parameter, wherein said determination means are adapted to deliver a signal representative of the real gain of said voltage-controlled oscillator;

divider means having a first input adapted to receive from said determination means the signal representative of the real gain of said voltage-controlled oscillator, and a second input adapted to receive said modulation signal; and an output delivering said modulation signal, divided by said real gain of said voltage-controlled oscillator, to an input of a summation circuit connected between the input of said voltage-controlled oscillator and a loop filter connected between the output of said phase comparator and the input of said voltage-controlled oscillator.

2. The synthesizer claimed in claim 1, wherein said determination means include measuring means for measuring the output voltage of said loop filter at a first frequency and at a second frequency, and a calculation unit for calculating said real gain of said voltage-controlled oscillator by dividing the difference between said first and second frequencies by the difference between first and second control voltages respectively measured at said first and second frequencies.

3. The synthesizer claimed in claim 2, wherein said determination means further include an analog-to-digital converter adapted to convert a voltage measured by said measuring means into a digital signal and said calculation unit is a digital unit.

4. The synthesizer claimed in claim 1, wherein said modulation compensation means include a multiplier for multiplying said modulation signal by $2\pi$, an accumulator whose input is connected to the output of said multiplier, a unit for forming an in-phase signal I and a quadrature signal Q, a first mixer, and a second mixer, wherein each mixer is in a branch of said feedback loop upstream of said counter-divider, said first mixer is adopted to mix said in-phase signal I with the output signal of said voltage-controlled oscillator and said second mixer is adapted to mix said quadrature signal Q with the output signal of said voltage-controlled oscillator phase-shifted by $\pi/2$.

* * * * *